United States Patent [19]
Battocletti et al.

[11] Patent Number: 4,615,009
[45] Date of Patent: Sep. 30, 1986

[54] ELECTRONIC ENERGY AND POWER MONITORING APPARATUS

[75] Inventors: Frank E. Battocletti, Columbus; Scott H. Hammond, Hilliard, both of Ohio

[73] Assignee: TransData, Inc., Dublin, Ohio

[21] Appl. No.: 466,729

[22] Filed: Feb. 16, 1983

[51] Int. Cl.[4] .................. G01R 21/133; G01R 22/00; H01H 9/20; H02B 11/16
[52] U.S. Cl. ............................ 364/483; 200/50 AA; 324/141; 324/142; 361/391
[58] Field of Search ............... 364/492, 493, 482, 483; 324/83 R, 99 D, 103 R, 95, 116, 107, 113, 111, 141, 142; 361/364, 369, 372, 336, 338, 342, 391; 200/50 AA

[56] References Cited

U.S. PATENT DOCUMENTS

| | | | |
|---|---|---|---|
| 4,077,061 | 2/1978 | Johnston et al. | 364/483 |
| 4,139,748 | 2/1979 | Wolfe et al. | 200/50 AA |
| 4,210,951 | 7/1980 | Ritter et al. | 361/391 |
| 4,217,545 | 8/1980 | Kusui et al. | 324/107 |
| 4,250,552 | 2/1981 | Elms | 364/483 |
| 4,283,772 | 8/1981 | Johnston | 324/103 R |
| 4,356,446 | 10/1982 | Battocletti | 324/142 |
| 4,365,302 | 12/1982 | Elms | 364/483 |
| 4,378,524 | 3/1983 | Steinmüller | 324/107 |
| 4,408,283 | 10/1983 | Kovalchik et al. | 364/483 |
| 4,467,434 | 8/1984 | Hurley et al. | 324/103 R |
| 4,475,081 | 10/1984 | Kobayashi | 324/107 |

OTHER PUBLICATIONS

Seidman et al., Electronics, Devices, Discrete and Integrated Circuits, 1977, 318–321, Merrill Publishing Company.
Kohler et al., Solid-State High Precision kWh and kVArh Meter in a 19" Plug-in Case, Siemens Review XLIV (1977) No. 11; 508–513.
General Electric brochure—"Instructions DS-50 and DS-60 Series Polyphase Switchboard Watthour Meters".
Brochure—"BE1-32 and BE1-32D Directional Power Relays" by Basler Electric, Highland, Ill., No. UBH-1, 9-78.
Brochure—"BE1-51 and BE1-51/27 Digital Overcurrent Relay" by Basler Electric, Highland, Ill., No. UBA-2, 11-78.
Brochure—"Drawout Relay Cases Size C", No. 7384 by General Electric Company, Aug. 14, 1978.
Brochure—"Drawout Relay", No. 7205 by General Electric Company, Jun. 1, 1959.

Primary Examiner—Felix D. Gruber
Attorney, Agent, or Firm—Mueller and Smith

[57] ABSTRACT

An assembly for monitoring or metering a plurality of electrical energy and power parameters wherein six current and six voltage stepped down transformers are associated with a drawout cradle in conjunction with a series of functional printed board circuit to achieve a conservation of components and a high degree of compactness in packaging. Accessibility for calibration and similar maintenance procedures is provided at the panel front of the apparatus and simple access to test outputs is provided at the front thereof. A connection plug arrangement is used to provide make before break switching with monitored power paths and for the purpose of providing additional calibration inputs at the forward portion of the assembly without resort to involved housing removal procedures. In one embodiment, a summing circuit is used in conjunction with Q and watt multiplier circuits to provide an analog var output in conjunction with pulse characterized watthour and Qhour outputs.

20 Claims, 11 Drawing Figures

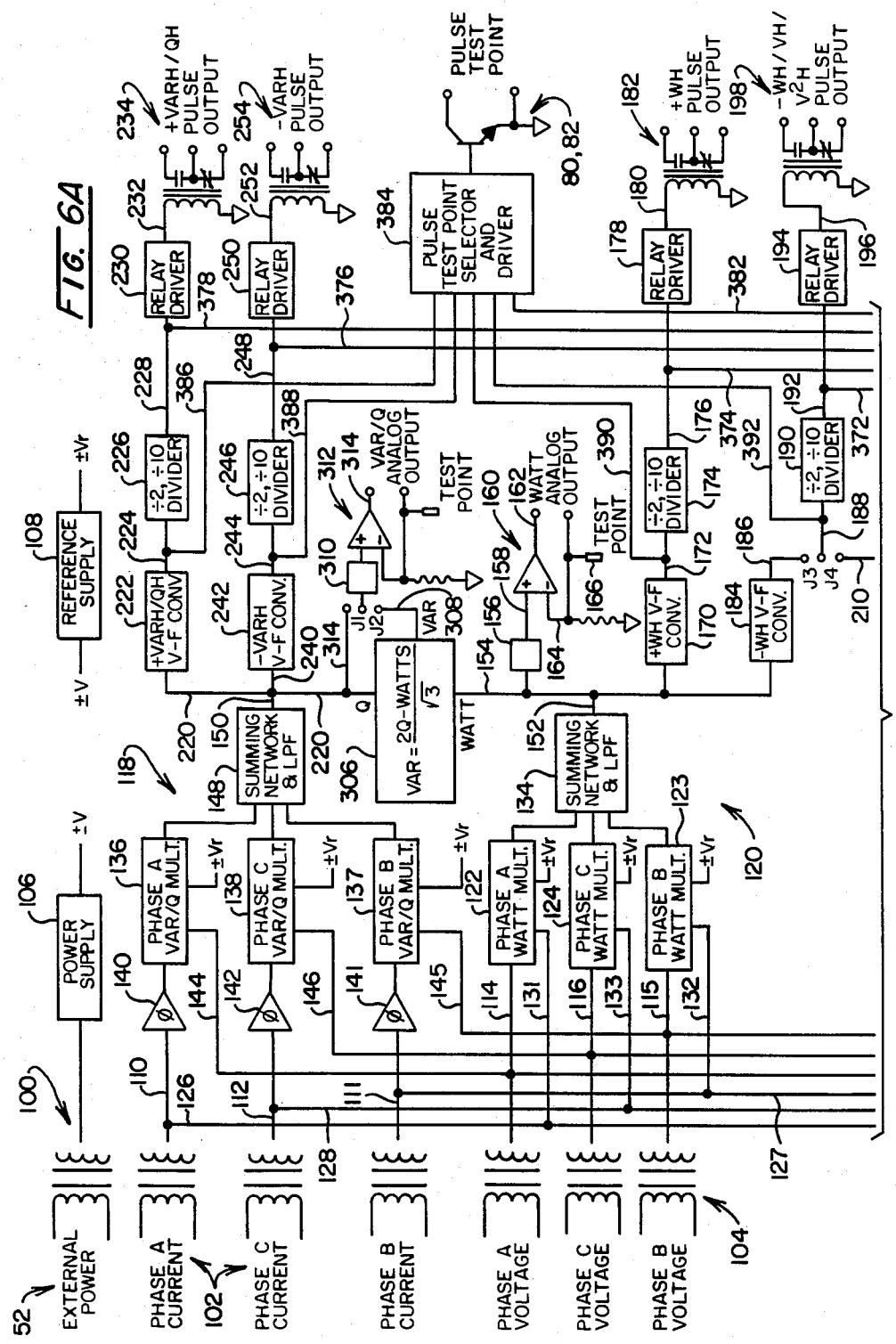

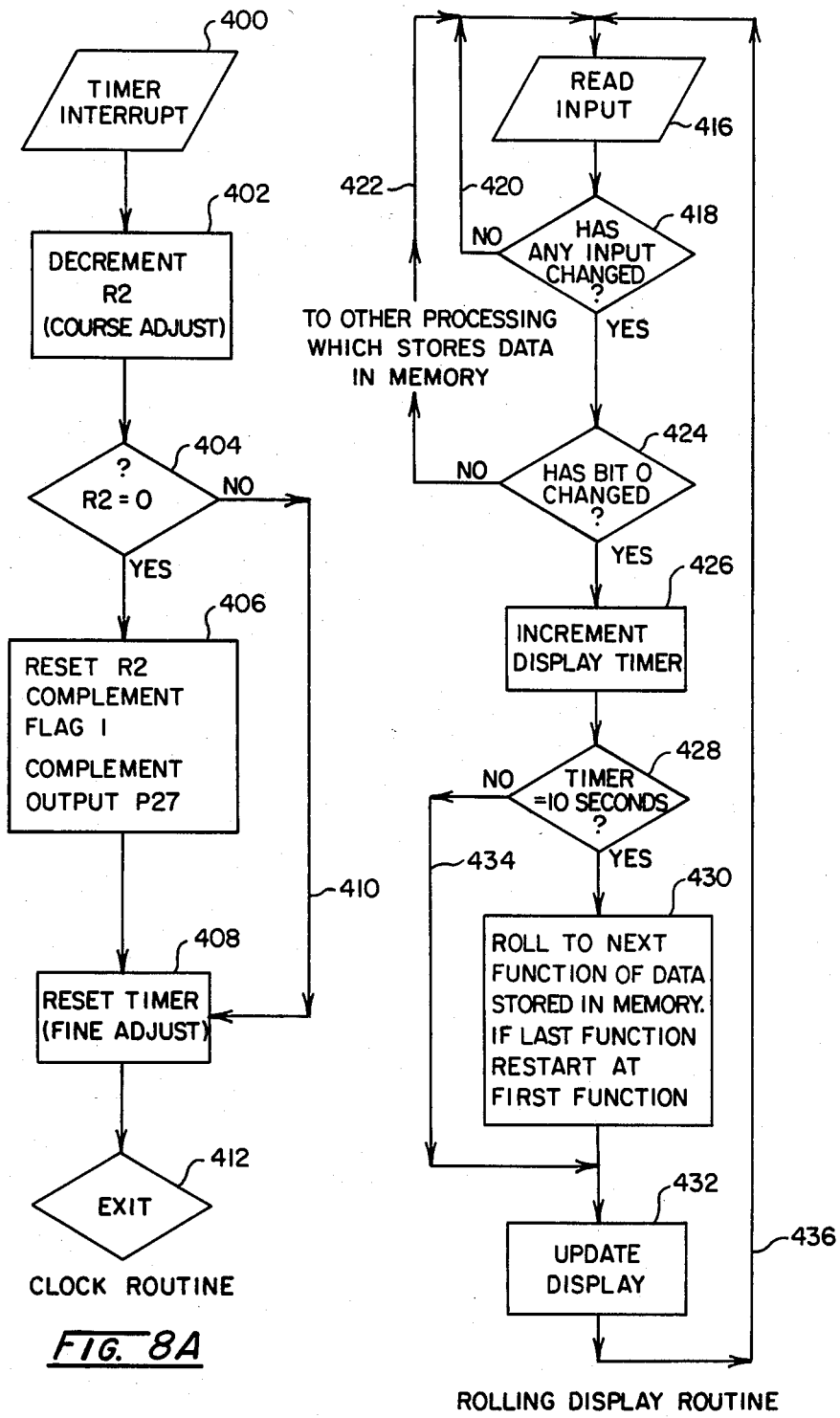

ELECTRONIC ENERGY AND POWER MONITORING APPARATUS

BACKGROUND

Electrical utilities and principal power consuming industries employ a wide variety of instruments in evaluating, costing and analyzing distributed electrical energy and consumed power. Rather extensive collections of instruments will be found both adjacent power consumption and generation sites as well as at terminal or tie points of distribution grids. Generally each principal distribution path of a utility system will be monitored for a significant number of both real and reactive energy and power parameters, such parameters being acquired for visual readout by operational personnel, by remote reading by a data acquisition system, as well as for storage upon magnetic media or the like. Depending upon the particular metering and analytic approach taken by a user, recorded data then are manipulated to achieve a desired evaluation of the consumption and distribution process. Of the parameters the industry will select, for example, watthour, varhour, Qhour, Volt$^2$hour, volthour, ampere$^2$hour and amperehour will be employed. Additionally, watt, var, Q, ampere and volt analog functions may be utilized in various combinations.

As is apparent from the above, the instrumentation which will be required for any given path monitoring function may be extensive. In this regard, the general practice of industry has been to provide a collection of instruments and group them, for example in a dedicated panel structure for operator utilization. For the most part, each instrument within an assemblage thereof is dedicated to a singular function, i.e. separate meters are utilized for the generation of watthours and volthours. Similarly, separate transducers, each employing polyphase current and voltage transformers in combination with dedicated multiplication circuits are utilized for the generation of such analog functions as watt, var and Q. Generally, for power related monitoring applications, six transformers will be incorporated within each such instrument in combination with six dedicated multiplier circuits. Further, the instruments themselves are assembled as an integral unit, any maintenance being carried out by resort to rather involved disassembly procedures. Such maintenance further requires a dismantling of the instruments to carry on necessary calibration procedures utilizing standards and like devices. The availability of user access at the face of these instruments for calibration and repair could be of considerable practical benefit. To the present, however, only metering function providing for meter readout and pulse initiator derived power consumption output signals have been incorporated in housing structures which are accessable from the front panel region.

Accordingly, the myriad of instruments assembled within a typical installation generally must be calibrated and maintained by labor intensive procedures of removal of entire instruments from mounting panels and the like. Further, the necessary collection of instrumentation for each distribution path necessarily evokes somewhat extensive and concomitantly costly installations in terms of space for carrying out necessary monitoring and data acquisition procedures.

SUMMARY

The present invention is directed to an assembly and apparatus for monitoring the electrical power supplies which combines a broad variety of monitoring functions in an advantageously compact housing structure. This structuring is achieved by a unique multiple function utilization of common voltage and current transformer components, as well as by a unique approach to the conservation of multiplication components. To achieve an aspect of maintenance and repair labor conservation, a housing assembly suited, for instance, for conventional panel installation is provided which is structured in combination with circuit boards to permit calibrating access at the front face locale of the assembly. Thus, disassembly to permit calibrational maintenance is advantageously avoided. Further, through resort to a connection plug design, power path input lines can be close circuited and the monitoring circuitry isolated therefrom without dismantling such that test and calibration signals can be applied at the front panel of the device without removing it from its principal installation.

Through the use of a drawout carriage assembly, maintenance procedures further are enhanced, inasmuch as removal of principal housings and disconnection of principal connections are not required to carry out inspection and gain access to all monitoring circuit components. Utilizing a series of functionally dedicated and readily slideably removable printed circuit boards, within the noted drawout carriage assembly, an arrangement for interconnection is made wherein a card connector form of association is effected between the carriage and the rear panel of the device upon the nesting insertion of the carriage within its permanent housing.

Another object and feature of the invention is to provide an assembly for monitoring an electrical power supply including a housing having rear wall and spaced apart peripheral walls defining an interior cavity extending inwardly from an opening. A plurality of discrete spaced first conductors are mounted upon a select one of the peripheral walls within the cavity, while a polyphase terminal output is connected to an outwardly disposed surface of the housing. These terminals are electrically connected with the first conductors within the housing. Also provided are a plurality of signal output terminals which are mounted upon the housing and extend into the cavity thereof to form a receptor portion. A drawout cradle is provided which is slideably nestable within the housing cavity and which has a receiving arrangement for supporting a plurality of electrical circuit components such as circuit boards, as well as a plurality of second conductors which are essentially spaced above the noted first conductors mounted within the housing. The cradle further incorporates a multi-conductor electrical connector located to be operationally engageable in multi-path electrically conducting relationship with the signal output terminal receptor portion when the drawout cradle is nestably positioned within the cavity. A connection plug is provided having a plurality of discrete spaced conductors contactable between first and second conductors when inserted within the housing cavity intermediate the peripheral wall carrying the first conductors and the drawout cradle mounted second conductors. The cradle is arranged to support three monitoring function voltage transformers and three monitoring function current transformers, each electrically coupled with a predetermined second conductor for select phase designated energization from the polyphase terminals and which has outputs corresponding therewith. A readout arrangement is provided including a forward panel for providing select visual electrical metering digital readouts mounted upon the drawout cradle such panel being positioned at the housing opening when the cradle is nestably positioned within the cavity and a multiplier circuit arrangement is provided mounted upon the drawout cradle and coupled to selectively receive the outputs of the current and voltage transformer. The multiplier circuit is coupled with the readout arrangement and selected conductors of the multi-conductor electrical connector for asserting pulse categorized power parameter signals at the digital readouts and select signal output terminals and corresponding analog characterized power parameter signals at the signal output terminals.

Another object of the invention is to provide apparatus for monitoring an electrical power supply which includes a housing having a rear wall and spaced apart peripheral walls defining an interior chamber, as well as first terminals supported on the housing and connectable with the monitoring input from power supply. A second terminal arrangement is provided which is supported by the housing for providing signal outputs and voltage transformers are provided which are supported by the housing and energizable from the first terminal for deriving voltage monitoring function signals. Similarly, current transformers are provided which are supported by the housing and energizable from the first terminals for developing current monitoring function signals. A readout arrangement is incorporated for providing select visual electrical metering digital readouts in response to pulse categorized signals which are asserted to it. First and second multiplier networks are provided each of which are responsive to the voltage and current monitoring function signals, respectively, for developing analog watt signals and analog Q signals. A var summing network is mounted within the housing which is responsive to the analog watt and Q signals to derive analog var signals corresponding therewith. Voltage to frequency converters which are responsive to the analog watt and Q signals are installed within the housing for deriving pulse characterized power signals which are asserted at the readout arrangement. A circuit arrangement is provided to develop the analog var signals as signal outputs of the second terminals.

Other objects of the invention will, in part, be obvious and will, in part, appear hereinafter.

The invention, accordingly, comprises the apparatus and assembly possessing the construction, combination of elements and arrangement of parts which are exemplified in the following detailed disclosure.

For a fuller understanding of the nature and objects of the invention, reference should be had to the following detailed description taken in conjunction with the accompanying drawings.

BRIEF DESCRIPTION OF THE DRAWINGS

FIG. 5 is a perspective view of a test connection plug device utilized with the apparatus of FIG. 1;

FIGS. 6A and 6B are a block schematic drawing of the circuitry incorporated within the apparatus and assembly of FIG. 1;

FIGS. 8A and 8B comprise a flow chart of pertinent aspects of a program of a microprocessor control arrangement utilized with the apparatus of the invention.

DETAILED DESCRIPTION

Figure 1:
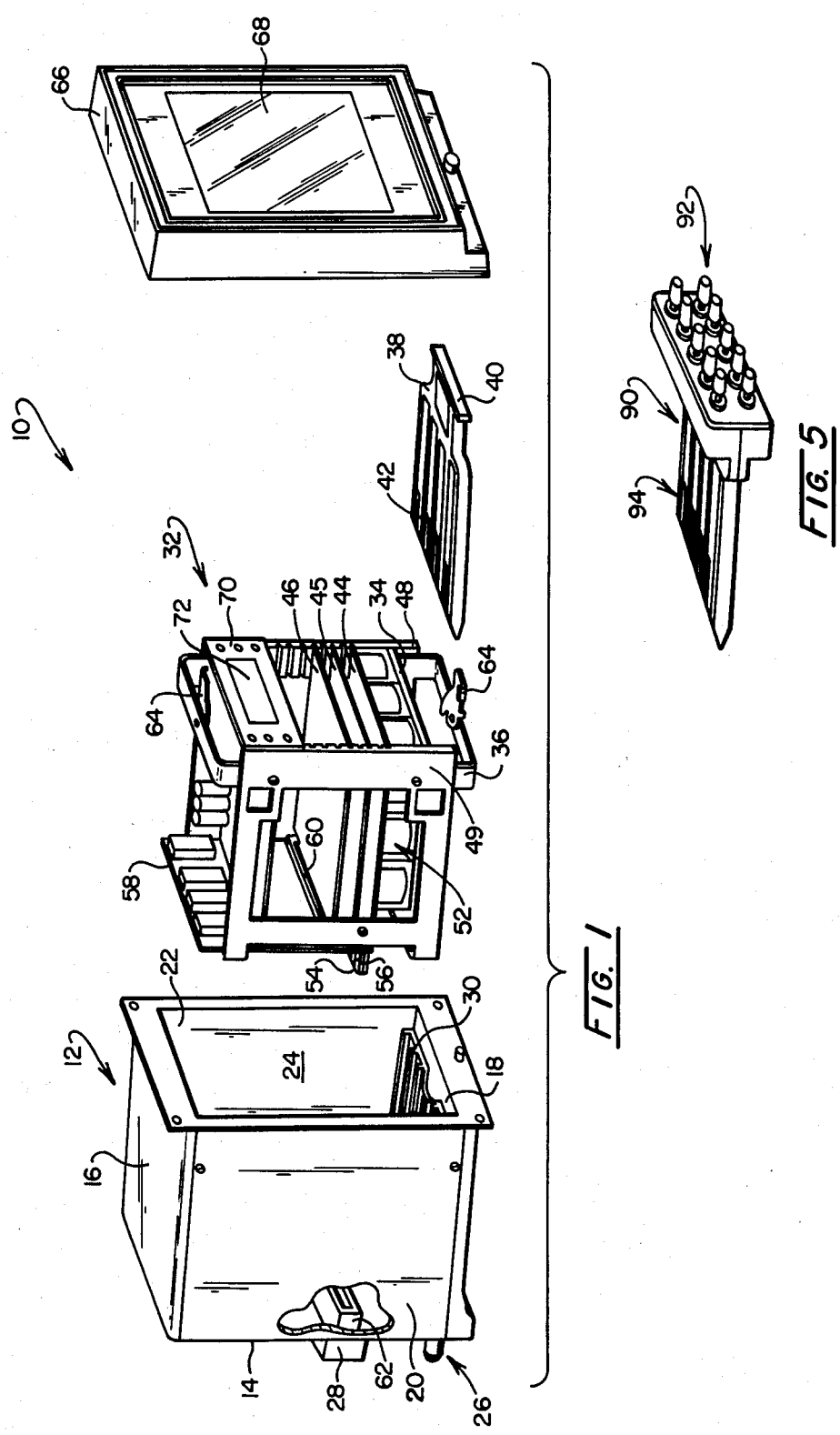
FIG. 1 is an exploded perspective view of an assembly and apparatus according to the invention with portions broken away to reveal internal structure.

The apparatus of the instant invention is structured so that a multitude of monitoring or metering functions may be accommodated within a singular, relatively low bulk housing which may conveniently be mounted within the standard panel readout structure of a substation or the like. A housing selected for the instant application supports monitoring signal treatment circuitry suited to carry out a multitude of functions heretofore provided by racks or banks of individual transducers or monitoring units.

Utilities or industrial users generally will have developed more or less specialized requirements for the number and type of functions desired for any path monitoring installation. Thus, while the singular housing of the instant invention may serve to replace a multitude of transducer and power metering functions, its design necessarily has been called upon to provide for a considerable flexibility permitting its economical customization for each user installation. To gain some insight into the number of functions which the apparatus is called upon to perform in one combination or another, it may be observed that the conventional transducer functions will include the monitoring or measurement of watts, var, or Q. In the same regard, instruments may be required which will be called upon to provide discrete phase analog output measurements of volts and amperes, as well as, for example, volts$^2$. Generally, the instruments are required to work on a polyphase basis. It may be observed that where Q is monitored, all Q values are positive from 30° leading (0.866 power factor leading) to 90° lagging (0 power factor lagging). Q is defined as volts $\times$ amperes $\times$ cosine $(\theta - 60°)$, while vars are defined as volts $\times$ amperes $\times$ cosine $(\theta - 90°)$. In terms of the metering of power, the devices are called upon to provide combinations of watthours, varhours or Qhours as well as volt$^2$ hours. Generally, the user will desire a pulse defined watthour signal in combination with a corresponding varhour or Qhour pulse defined output. Usually, the user desire is for a watthour output capability combined with a Qhour capability and a var analog output. Such requirements heretofore have necessitated a considerable amount of monitoring equipment including numerous stepped down transformers, particularly where three-phase monitoring is carried out. Another aspect of the use of multifunction monitoring and metering devices as now considered resides in the need to carry out periodic calibration and adjustment procedures. In many instances, these procedures can be accomplished by the user utilizing appropriate standards and the like and it is desirable that such procedures be carried out as efficiently as possible. In this regard, it is most desirable that a capability for calibration be provided which does not necessitate the removal of entire instrumentation housings from a panel to gain access to appropriate calibration points of monitoring circuitry.

Further, where removal of components is necessitated, the removal should be of a modular aspect such that loss of the entire multi-function system is not the penalty for providing factor repair for one functional circuit.

Referring to FIG. 1, a housing and general structural arrangement of the apparatus of the invention is revealed in exploded fashion in general at 10. Apparatus 10 includes a principal housing 12 formed of a rear wall 14 and peripheral walls such as top wall 16, bottom wall 18 and spaced-apart sidewalls 20 and 22. These walls combine to provide a chamber or cavity 24 within which various circuit components are retained.

Figure 3:
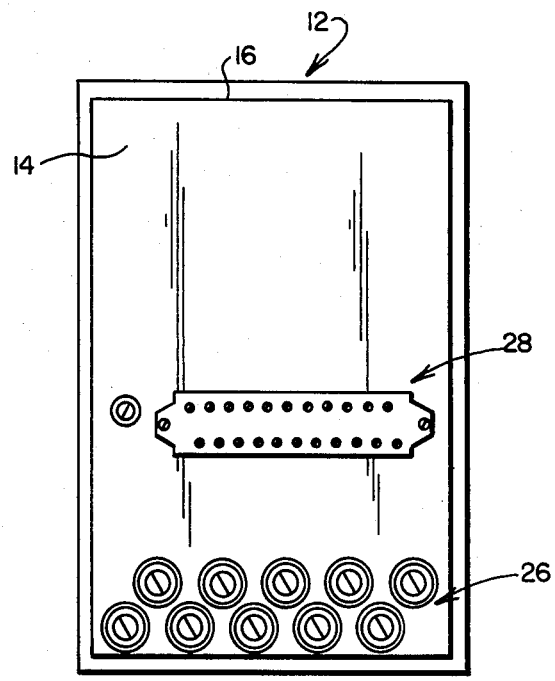
FIG. 3 is a rear view of the apparatus of FIG. 1.

Looking to both FIGS. 1 and 3, the rear wall 14 of housing 12 is shown to support an assemblage or array of input terminals represented generally at 26, along the lower level thereof. The terminals within assemblage 26 are provided for connection with polyphase input lines intended to be monitored by the apparatus. Rear wall 14 further carries an array or assemblage 28 of output signal terminals, one such terminal also serving as a conventional input power supply for purposes of energizing the monitoring and metering circuits within housing 12. These rearwardly disposed output signal terminals provide outputs at the rear of the device corresponding to all monitoring and metered functions and the connections thereto extend, for example, to computers, analog metering devices and the like.

Returning to FIG. 1, it may be observed that the bottom wall 18 of housing 12 carries an array of elongate resilient finger-like conductors 30. These conductors are spaced in a predetermined pattern and are coupled with corresponding output terminals of the assemblage 26 at rear wall 14.

The readout devices and circuitry of the assembly of the invention are mounted upon a drawout cradle 32. Cradle 32 is formed having a bottom surface structure 34 which carries a plurality of 10 resilient finger-like conductors (not shown) which serve ultimately to transmit monitored inputs from terminal assemblage 26 into the monitoring circuitry of assembly 10. The bottom structure 34 is spaced above the lowermost level of the frame of cradle 32, for example, in consequence of the spacing structure 36. This spacing is provided such that a connection plug 38 having a hand-grip component 40 may be inserted intermediate the resilient conductor array 30 and the corresponding conductors downwardly mounted upon surface structure 34 of cradle 32. In this regard, the connection plug 38 carries a corresponding array of conductors 42 on each side thereof to effect electrical interconnection between input terminal array 26 and the inputs to the circuitry carried by cradle 32. The use of such connection plugs is common in the power relay manufacturing arts as well as in certain early disk meter installations. Through the use of the plug 38, a make before break interconnection may be employed such that removal of the plug provides for a shorting of the paths of power input through terminal assemblage 26 to avoid damage. The plug finds considerable use for the instant application, inasmuch as it may very simply be removed in conjunction with calibration and maintenance procedures and replaces the "test switches" otherwise required.

Figure 4:
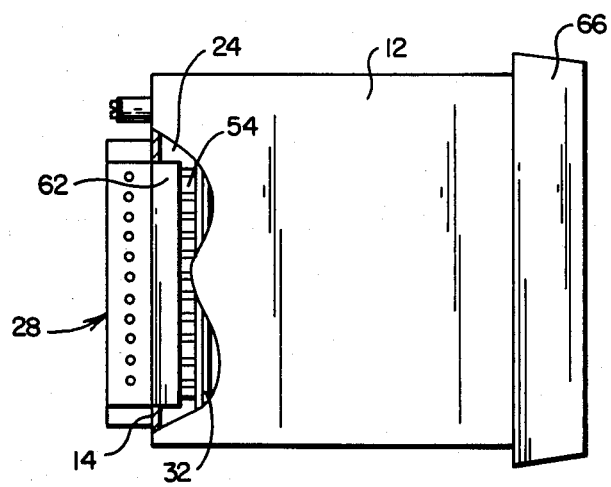
FIG. 4 is a top partial sectional view of the apparatus of FIG. 1.

FIG. 1 reveals that the drawout cradle 32 supports a series of circuit boards 44–46 which slide into the frame of the cradle and are supported in place by virtue of a slotted connection within each of the front corner posts of the cradle, which are revealed at 48–49. The rear of a boards 44–46 is supported by the circuit board connector on a mother board 58. The lowermost circuit board 44 serves to support seven downwardly depending stepped down transformers represented generally at 52. These transformers 52 form the inputs to the circuitry and, thus, are associated with the contact components formed on the bottom of earlier-described bottom surface structure 34. Circuit board 44 also is configured to extend rearwardly of the frame of carriage 32 and to provide a male, multi-terminal card connector assembly 54 thereat. Referring additionally to FIG. 4, card connector assembly 54 is shown to be formed to provide an array of spaced parallel conductor surfaces 56 which are in electrical communication with the numerous outputs of discrete networks within the electrical circuitry of assembly 10. These outputs are discussed in detail later herein. The distribution of signals along the circuits within cradle 32 is provided by the vertically disposed, rearwardly positioned distribution or "mother board" 58. Circuit board 44 carrying the transformer inputs is permanently connected with distribution board 58, inasmuch as it is universally present in all embodiments of the assembly 10, while the individual circuit boards as at 45 and 46 are joined with distribution board 58 through conventional circuit board connectors, one of which is shown at 60.

FIGS. 1 and 4 reveal that when carriage 32 is nestably positioned within the chamber or cavity 24 of housing 12, card connector 54 will be inserted automatically within a corresponding female plug 62 which, in turn, communicates with the signal output terminal array 28 mounted upon the outwardly disposed surface of rear wall 14.

Cradle 32 is retained in position assuring appropriate mating between connector 54 and plug 62 by over-center latches as at 64. The entire assembly 10 is secured by the positioning of a window assembly 66 over the forwardly disposed opening of chamber 24.

In addition to the output signals provided at terminal array 28, a visual readout is provided through window 68 of front window assembly 66. This visual readout is mounted upon carriage 32 at 70. Looking additionally to FIG. 2, the readout 70 is shown to include a liquid crystal display 72, for example, of the six digit variety, which operates in conjunction with hold, set/reset and test/advance switches shown respectively at 74–76. At the opposite side of readout 70, there is provided a load rate indicator 78 which may be an LED as well as pulse test points or jacks 80 and 82. Of these two connecting points, jack 82 serves as a common or ground. As will be seen later herein, signals corresponding with the pulse categorized output of the function being displayed by display 72 simultaneously are presented at test jacks 80 or 82 and thus serve for testing at the front panel itself simultaneously with test visual readout. The visual representations or displays of readout data provided by the circuit are displayed in a continually sequencing manner at readout 72 in conjunction with the noted pulse output signals derived using jacks 80 and 82. Advancing to other readout functions is automatic, but can be accelerated by actuation of switch 76, while setting the device or initializing the readout sequence can be provided by actuation of switch 75.

Figure 2:
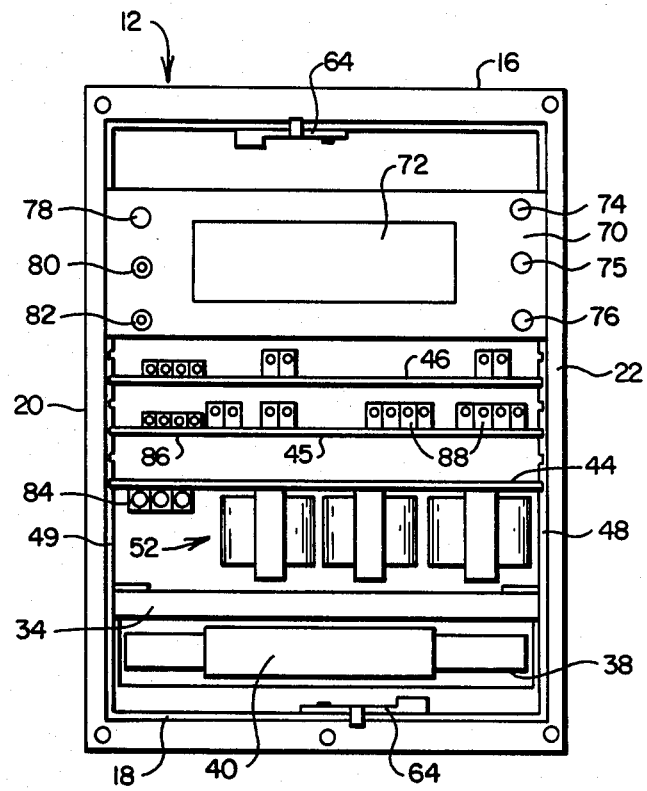
FIG. 2 is a front view of the apparatus of FIG. 1 with portions removed to show internal structure.

Conventional potential indicators for three phases being monitored are provided by LED array 84 mounted upon transformer circuit board 44. FIG. 2 reveals a typical arrangement of the circuit boards as at 45. With the technique of the instant invention, each of the circuit boards as at 45 will contain forwardly disposed test points as at 86 as well as corresponding arrays of calibrating potentiometers as at 88. Thus, the operator may carry out calibration procedures without removing the carriage 32 from cavity 24. Each of the circuit boards above the transformer array 52, i.e. as at 45 and 46, is removably insertable within carriage 32 from the forward portion or opening of housing 12. Because each of the circuit boards as at 45-46 are structured carrying discrete functions, for example watt development or ampere output readings, they may be individually removed without affecting the performance of any remaining monitoring and metering functions of the apparatus 10.

To summarize the general geometry of the apparatus 10, inputs to be monitored are directed through terminal array 26 which are then selectively distributed through connection plug arrangement 38 to the various circuits within carriage 32. The initial input to carriage 32 is through the array of stepped down transformers 52. Power input to the circuits mounted upon the carriage 32 is derived from one terminal of the terminal array 28 at the rear of housing 12 and all outputs, whether analog or pulse categorized are provided at this rearwardly disposed location. However, additionally, pulse categorized output signals representative of real and reactive power are supplied at the forwardly disposed portion of carriage 32 through display at LCD readout 72. Calibration of the arrangement in situ is provided both by test jacks 80 and 82 which are activated in conjunction with the display at LCD 72, as well as through the utilization of test points as at 86 in conjunction with potentiometer adjustments as at arrays 88 at the forwardly disposed portion of the assemblage 10. Circuit boards which are dedicated to a particular function may be removed from the forward portion of the assemblage 10. Adjustment and calibration proceedings at the forward portion of the assemblage 10 can be carried out by removal of the plug 38 to effect a shorting of the current input terminal array 26 and disconnection of the remaining circuits from such inputs. However, as described earlier herein, the power supply for all circuits is derived from output signal terminal array 28. Thus, calibration procedures are simply carried out by removal of plug 38, power remaining for electronic circuitry. By utilization of the connector plug 38, test switches generally required externally of metering devices and the like are avoided.

To further enhance the capability of carrying out calibration and maintenance from the forwardly disposed portion of apparatus 10, a test plug common to the relay manufacturing arts is provided. Referring additionally to FIG. 5, a test plug assembly is represented generally at 90 having a forwardly disposed terminal array 92 structured identically with the input terminals within assemblage 26. Plug 90 also includes upwardly disposed resilient conductive strips or fingers as represented generally at 94 which serve to provide circuit paths for the operator for use in conjunction with the assertion of test or calibration signals into the circuitry within carriage 32. Generally, one or more shorting connections are made using terminal array 92 to provide the equivalent of a test switch function.

Figure 6B:
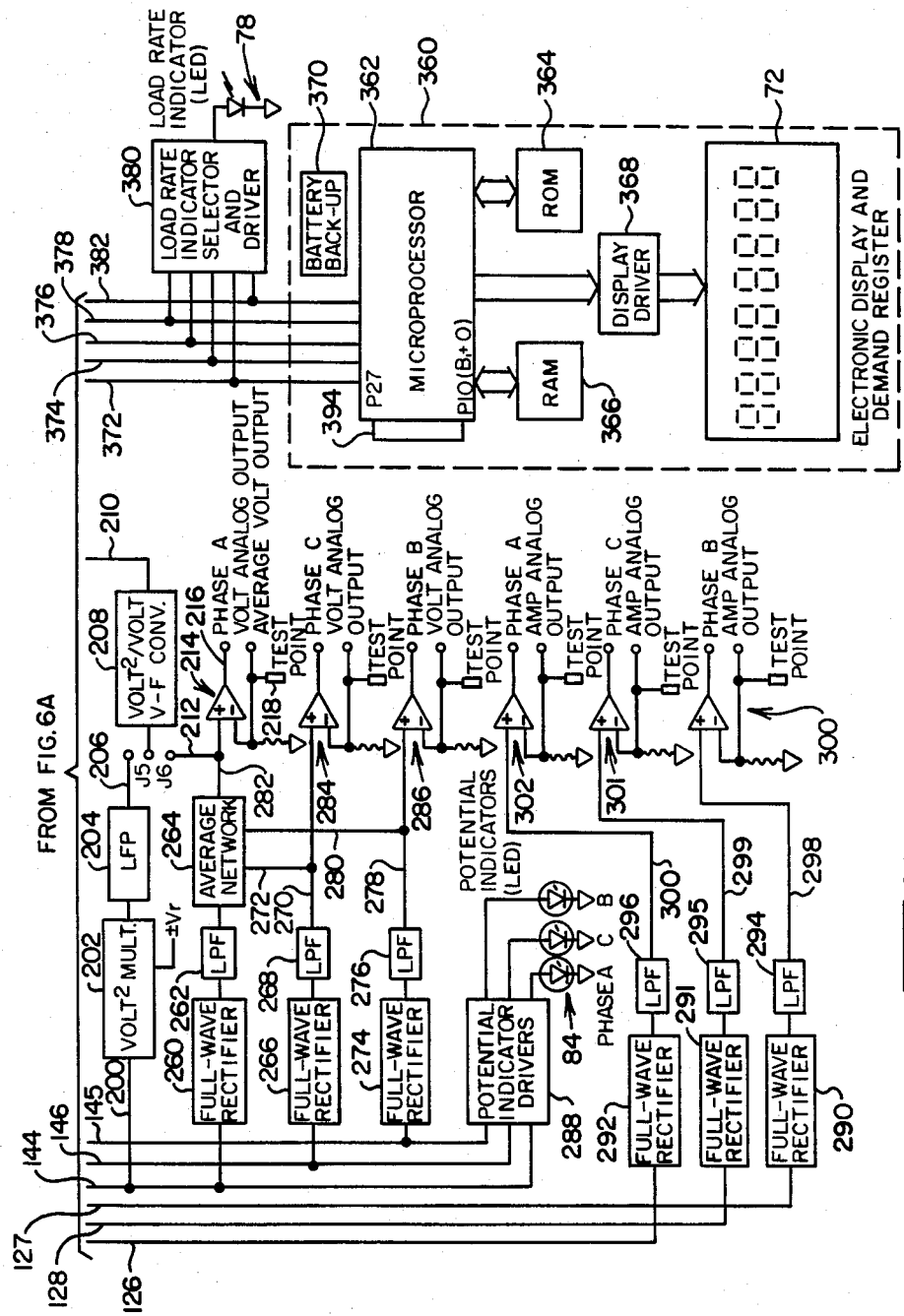

Referring to FIGS. 6A and 6B, a schematic representation of the circuit components mounted within carriage 32 is revealed. FIG. 6B should be positioned below FIG. 6A in the manner indicated by the labeling on each drawing. These figures do not delineate which circuits are formed upon discrete circuit boards in the interest of clarity. However, it should be understood that a preferred embodiment of the invention provides for the provision of given particular functions upon predetermined ones of the circuit boards to effect modularity for repair and function modification purposes.

FIG. 6A shows the array of stepped down transformers earlier described at 52 in conjunction with FIG. 1 as including an external power transformer 100, three current transformers 102 suited for 3-phase monitoring and designated by phases "A-B-C" and three voltage transformers 104 having like common phase designations "A-B-C". External power transformer 100 receives a conventional 60 Hz, 120 V input through select terminals of the output signal terminal array 28 and serves to provide a DC power supply to the circuitry at hand as represented by block 106. This power supply is labeled as $\pm V$. The latter power supply also serves to provide the input to a a reference power supply generated by conventional circuitry represented at block 108 to derive a reference voltage designated $\pm V_r$. This latter reference voltage will be seen to be utilized in conjunction with multiplication networks. Such reference supply circuits generally are reference diode based and provide a very accurate and time and temperature stabilized reference signal.

The secondary outputs of phase A, B and C current transformers 102 are represented schematically as being established at respective lines 110-112. In similar fashion, the secondary outputs of phase A-C voltage transformers 104 are provided respectively at output lines 114-116.

The outputs of current transformers 102 and voltage transformers 104 are directed to respective multiplication circuit groupings 118 and 120. Individual multiplier networks in each of these circuits provide a product derivation preferably under the concept of time division multiplication. For example, the multiplier produces a pulse waveform whose amplitude is proportional to one variable, whose length relative to period is a function of another variable, and whose average value is proportional to the product of the variables. Early investigations of the use of electronic time division multipliers are reported upon in the following publications which are incorporated herein by reference:

I. E. A. Goldberg, "A High Accuracy Time Division Multiplier", *RCA Review*, Volume XIII, pp. 265-274, September, 1952.

II. Sternberg, "An Accurate Electronic Multiplier", *RCA Review*, pp. 618-634, December, 1955.

III. R. Bergeest and P. Seyfried, "Evaluation of the Response of Time-Division Multipliers to A.C. and D.C. Input Signals", IEEE. Transactions on Instrumentation In Measurement, Vol. 1 M-24, No. 4, pp. 296-299, December, 1975.

Time division multiplier networks generally are configured having a pulse width modulation circuit which is fed one of two input parameters and a switching circuit, usually controlled by the output signal of the modulator. For the instant application, a principle wherein the modulation factor is proportional to an input quantity is utilized and the pulse or sampling frequency is variable in accordance with an input amplitude, an integration procedure being resorted to.

The particular form of multiplier circuit considered preferable for use with the instant invention is described in detail in U.S. Pat. No. 4,356,446 by Battocletti, which patent is incorporated herein by reference.

Looking to multiplier circuit grouping 120, it may be observed that each of the multiplier circuits 122-124 of circuit grouping 120 receives a voltage designated input from along respective lines 114-116, and a corresponding current signal input from along respective lines 131-133 extending, in turn, from lines 126-128. Further, reference voltage, $V_r$, is introduced to the circuits to provide outputs which are directed to low pass filtering and summing function as represented at block 134.

Multiplier circuit grouping 118, including multiplier networks 136-138 corresponding with respectively labeled phases A-B is substantially identically configured. However, inasmuch as these networks provide an output corresponding with Q or var values, a phase adjustment network is provided for each as represented, respectively, at 140, 141 and 142. Thus, the phase A designated current input at line 110 is phase adjusted at block 140 prior to assertion at multiplier network 136. The network additionally receives a reference voltage, $V_r$, input and a corresponding phase A designated voltage input from along lines 114 and 144. Phase B designated multiplier network 137 similarly receives a phase B designated current signal from along line 111 which is phase adjusted as represented at 141, as well as a corresponding phase B voltage signal from along lines 115 and 145 and a voltage reference input, $V_r$. Finally, phase C designated multiplier network 138 receives a phase C current input signal at line 112 which is adjusted in phase at function 142, as well as a corresponding phase C designated voltage signal from along lines 116 and 146 and the noted reference signal, $V_r$. The outputs of multiplier networks 136-138 are directed through a low pass filter and are summed as represented at block 148. The arrangement as to whether a var output or a Q output is submitted to network 148 is determined by the degree of phase adjustment established by circuits 140-142. Note, that either a var designated 3-phase power output is generated at block 148 or a Q designated 3-phase power output, however, not both types of output. This follows from the desires of the industry for one or the other. Note further, that for typical 3-phase monitoring, only six transformers within groupings 102 and 104 are utilized. Assuming a var designated output is elected for multiplier circuit grouping 118, then the output at summing network 148, or line 150 may generally be represented as, VI sin $\theta$, while the corresponding output at line 152 of the summing network of block 134 may generally be represented as VI cos $\theta$. Various forms of outputs then may be derived from the instantaneous d.c. signals at lines 150 and 152. For example, line 152 is shown to extend to line 154 which, in turn, incorporates an isolation network represented at block 156. Line 152 then extends through line 158 to an operational amplifier stage represented generally at 160 wherein a watt analog output is generated at output line 162. This output at line 162 represents one of the signals provided at output signal terminal assemblage 28 extending from rear wall 14. The opposite input to stage 160 at line 164 is coupled to ground as well as to a test point 166. As described earlier in conjunction with FIG. 2, these test points are provided at a forwardly disposed test position which is accessible through window assembly 66.

Line 154 also extends to a +watthour voltage-to-frequency converter represented at block 170. Formed in conventional fashion, incorporating an integrator and pulse generating function, network 170 develops a corresponding pulse rate or frequency proportional to the integral of the instantaneous value of watts at line 172. This pulse characterized signal is directed to a binary and decade divider network represented at block 174, the output of which is directed along line 176 to a relay driver network 178, and thence from along line 180 to a relay 182. The output of relay 182 provides desirable isolation being generated as a form C,KYZ relay output. Generally, such a relay output will provide two contacts deriving a single pole double throw switching action. The designation of the watthour pulse output as being positive stems from an industry convention describing the direction of power flow. A positive indication represents that power is being consummed, as opposed to being produced, for example, by a utility customer. The output of relay 182 is directed to a select terminal within rear wall 14 mounted assemblage 28. Line 154 extends to a −watthour voltage-to-frequency converter represented at block 184. Converter 184 is structured substantially similar to converter function 170 and provides a pulse categorized output at line 186 which, through factory installed jumper J3 may be directed along line 188 to the input of a binary and decade divider function represented at block 190. The thus-adjusted pulse output at line 192 is directed to a relay driver network represented at block 194, the output of which at line 196 is utilized to drive another form C,KYZ relay output represented generally at 198. Depending upon the desires of the user, this output, as labeled, may be provided as −watthours, volthours or volts$^2$hours. The output is directed to a select terminal within rear wall 14 mounted assemblage 28.

Looking additionally to FIG. 6B, it may be observed that the secondary output of the voltage transformer of grouping 104 monitoring phase A is directed through line 200 to the input of a time division multiplier circuit represented at block 202. Fashioned as a conventional product forming circuit and responsive additionally to reference voltage, $V_r$, the output of circuit 202, representing a squaring of the voltage signal at line 144, is treated by passage through a low pass filter represented at block 204 to provide a corresponding volts$^2$ signal at line 206. Where line 206 is coupled by a factory installed jumper J5 to a voltage-to-frequency converter network as represented at block 208, then the output thereof at line 210 may additionally be coupled through jumper J4 (FIG. 6A) to the input of binary and decade divider 190. Accordingly, the signal therefrom at line 192 extends to relay driver 194 to provide the noted volts$^2$hours pulse output. The use of the volts$^2$ network will depend upon the particular desires of the user. Similar to the analog output arrangement described in conjunction with stage 160, a jumper J6 shown at FIG. 6B also may be utilized to couple the volts$^2$ signal output at line 206 through line 212 to a similar operational amplifier stage 214 which provides a current output signal at line 216 representing a volts$^2$ analog output which is directed to one terminal of output signal terminal assemblage 28 at rear wall 14. Stage 214 also includes a test point 218, as labeled, which is positioned on an appropriate circuit board at a forward position, for example as described at 86 in FIG. 2.

Returning to FIG. 6A, it may be observed that the output of summing network 148 at line 150 will represent either a var or Q 3-phase summed output which is directed to line 220. Line 220 extends to the input of a voltage-to-frequency converter network represented at block 222 which, depending upon the presence of a var or Q signal at line 220, will convert such signal to a pulse categorized one, the rate of which is proportional to the selected energy parameter. This signal is then directed, as indicated by line 224, to the input of a binary and decade divider represented at block 226. As before, divider network 226 provides for conversion of the pulse output at line 224 to a more usable frequency level and the corresponding adjusted output is directed as represented at line 228 to a relay driver network represented at block 230. Relay driver 230 provides an output as represented at line 232 which serves to drive a form C, type KYZ output at relay stage 234. This output will, depending upon the form of multiplication desired at circuit 118, be in terms of varhours or Qhours and will be provided at select terminals within output signal terminal assemblage 28 at rear wall 14.

The var value signal at line 150 also may be directed as represented at line 240 to the input of a voltage-to-frequency converter network represented at block 242 for purposes of developing a pulse categorized power signal at the output thereof represented at line 244. As before, the signal at line 244 is treated for purposes of developing a desired full scale frequency range through the utilization, for example of a binary and decade divider network represented at block 246. The output of divider network 246 is directed as represented by line 248 to a relay driver network represented at line 250, the output of which at line 252 is utilized for actuating a relay stage represented generally at 254. Stage 254 provides a form C, KYZ output suitably isolated from the circuitry of apparatus 10. This output is directed to a select output signal terminal of terminal assemblage 28 at rear wall 14.

Looking to FIG. 6B, line 144 extending from the secondary output of the phase A voltage transformer within grouping 104 is shown directed to a full wave rectifier represented by block 260. The rectified voltage signal from rectifier 260 is directed through a low-pass filter as represented at block 262, thence to the input of an averaging network represented by block 264.

In similar fashion, the secondary output of voltage transformer phase C within grouping 104 is directed to the input of a full wave rectifier represented at block 266. The output of rectifier 266, in turn, is directed through a low-pass filter represented at block 268, thence along lines 270 and 272 to averaging network 264. Phase B of voltage transformer grouping 104 is directed from along line 145 to a full wave rectifier network represented at block 274, the output of such network being directed through a low-pass filter as indicated by block 276 to output line 278. Line 278 is shown to be coupled to averaging network 264 through line 280.

The output of averaging network 264 represents an averaging of the voltage outputs of voltage transformer grouping 104 and is presented at line 282. Line 282 is directed to the input of operational amplifier stage 214 to provide an analog output representing average volts and that output is directed to a select terminal within terminal assemblage 28, as well as to a forward test point 218, as earlier described.

Where individual voltage outputs for each phase are desired, then additional output operational amplifier stages as at 284 and 286 are provided. The outputs of these stages are labeled, respectively, "PHASE C VOLTAGE ANALOG OUTPUT" and a phase B "VOLTAGE ANALOG OUTPUT" are presented at select terminals from within terminal output signal terminal assemblage 28 mounted upon rear wall 14. Test points for each of these outputs are provided forwardly of apparatus 10 as described above and are labeled on the figure.

The status of each line 144–146 additionally is monitored to provide appropriate excitation of the potential indicator LEDs described earlier in connection with FIG. 2 at 84. The driver circuit for selectively energizing these LEDs is represented by block 288 in FIG. 6B.

FIG. 6B also reveals that the three phase outputs of current transformer group 102 as represented at lines 126–128 are converted to d.c. signals by respective full wave rectifier networks as represented by blocks 292, 290 and 291. As before, the outputs of rectifier networks 290–292 are treated by respective low-pass filter stages represented at blocks 294–296 and the filtered outputs therefrom as represented, respectively, at lines 298–300 are directed to corresponding output, operational amplifier stages represented generally at 300–302. As before, the analog outputs of these stages 300–302 are phase related and are provided at select terminals within output signal terminal assemblage 28 at rear wall 14. Additionally, the test points, as labeled, are provided at the forward edges of the circuit boards in similar fashion as described in conjunction with FIG. 2 at 86.

From the foregoing discourse presented in conjunction with FIGS. 6A and 6B, it may be observed that common transformer groupings 102 and 104 are used with the assembly of the instant invention to provide a broad number of function outputs which otherwise would be required to utilize dedicated phase related transformers. Thus, an improvement in the size of the monitoring installation is realized, as well as in the cost of the provision of the multiple functions which are available with apparatus 10.

Returning to FIG. 6A, it may be recalled that a typical user of multiplier function monitoring and metering devices will desire a pulse categorized output for Qhour and watthour in addition to a watt analog signal output and a var analog signal output. Normally, the provision of Q and var functions is provided through the use of discrete groupings of three multiplier networks for each of these functions. With apparatus 10, the use of such additional multiplying networks is not required and there results an improved cost profile for the functions delivered as well as an elimination of the use of relatively scarce printed circuit board component space.

Assuming that the multiplier networks described above in conjunction with blocks 136–138 provide a phase adjustment developing a Q product output for summation at the summing network represented at block 148, then the pulse categorized outputs of converter function networks 222 and 242 will, respectively, be provided as Qhours. What next is desired is a var analog output. Accordingly, the Q signal output of summing network 150 is directed from along line 220 to a var deriving network represented at block 306. The opposite input to the network represented at block 306 emanates from the watt multiplication networks 122–124 which are summed at the network represented at block 134 for presentation at lines 152 and 154. The network represented at block 306, in effect, carries out an operation in accordance with the following relationship:

$$var = (2Q - watts)\sqrt{3}$$

Signals at lines 154 and 220 thus being acted upon, the resultant analog output at line 308 will correspond with var values. Assuming a jumper J2 is inserted, the signal then is passed through a conventional isolation network represented at block 310 and is treated at output stage operational amplifier 312. The output at amplifier 312 as at line 314 is a var analog output, as labeled, which is presented at a select terminal within terminal output signal terminal assemblage 28 at rear wall 14. As before, a test point is provided at the forward position of the relevant circuit board as represented at 86 in FIG. 2. In the event that a Q analog output is desired, then jumper J1 is utilized in preference over jumper J2 and the analog signal at line 220 is directed through line 314 to the isolation network represented at block 310.

Figure 7:
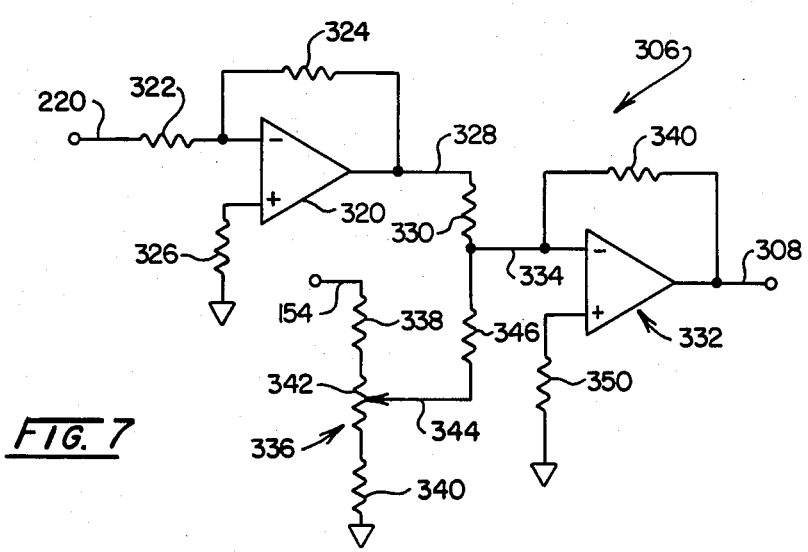
FIG. 7 is a schematic circuit drawing of a summing network utilized in connection with FIG. 5A.

Referring additionally to FIG. 7, an embodiment for the var derivation arrangement represented at block 306 is presented. The network, again shown generally by numeral 306, is structured in accordance with an alteration of the above equation deriving vars from Q and watts which may be derived as follows:

$$vars = (2Q - watts)(1\sqrt{3})$$

Assuming that the constant, $\sqrt{3}$, may be accommodated for by resort to scaling factors, then:

$$vars \alpha (Q - watts/2), \text{ or}$$

$$vars \alpha - (-Q + watts/2)$$

The last equation may be implemented as shown in FIG. 7, the Q output at line 220 being directed to the inverting input of an operational amplifier stage 320 having input and feedback resistors associated therewith, respectively, at 322 and 324 of equal resistive value and a bias compensating resistor 326 of half the above resistive values coupled to ground and the inverting input of the amplifier. The resultant output of amplification stage 320 at line 328 corresponds with a $-Q$ value which is directed through resistor 330 to the inverting input of a second operational amplifier stage 332 through line 334.

Correspondingly, the watt value analog signal from line 154 is directed to a divider network shown generally at 336 which includes resistors 338 and 340 of equal value coupled on opposite sides to ground and on opposite sides of a variable resistor 342. Resistor 342 is tapped at line 344 and the signal deriving therefrom is directed through resistor 346 to input line 334 of amplification stage 332. Resistors 330 and 346 are summing resistors of equal value. As before, a feedback resistor extends between lines 334 and output line 308, while a bias compensating resistor 350 of half the resistive value of resistor 340 is provided intermediate the non-inverting input of stage 332 and ground. The resultant output at line 308 is a signal essentially representing: vars x $\sqrt{3}/2$.

Returning to FIGS. 6A and 6B, the readout function may be observed to be provided in conjunction with a microprocessor based control, the latter function being represented within dashed boundary 360. The microprocessor function which, for example, may be provided as widely marketed type 8049, is represented by block 362 and operates in conjunction with a control program retained in read only memory represented by block 364 or internal to the microprocessor and operates in conjunction with data collected and retained in random access memory which is a part of the microprocessor represented at block 366. The visual readout of the microprocessor function 360 is reproduced at an 8-digit LCD shown at block 72 which is driven in conventional fashion by a display driver network represented by block 368. Network 368 is under the command signal control of the microprocessor 362. A battery back-up is provided within the microprocessor function 360 as represented at block 370 for purposes of assuring that no data are lost as collected within RAM 366. The input/output port functions of microprocessor 362 receive pulse characterized data from the divider networks and carry out processing thereupon to provide readouts corresponding with real and reactive energy as well as various demand data. Accordingly, it may be observed that the inputs to microprocessor 362 include an input from line 192 as represented at line 372, an input from line 176 as represented at line 374, an input from line 248 as represented at line 376 and an input from line 228 as represented at line 378. Selecting data from these inputs 372, 374, 376 and 378, the microprocessor function 362 carries out the appropriate display of the functions represented thereby in a continuing, rolling sequence unless that sequence is interrupted by the operator. The particular function being treated by the microprocessor and displayed also is represented by a corresponding energization of the load rate indicator light emitting diode 78 and the drive and selection for that output is represented by block 380. Control for selection as carried out by the function of block 380 is provided by a control output of microprocessor 362 represented by line 382.

Line 382 representing control by the microprocessor 362 also is shown extending to a block 384 which serves to provide a pulse test point selection function and drive function for the pulse test point inputs as described in conjunction with FIG. 2 at 80 and 82. To provide the data so selected by the function at block 384, it may be observed that the output of voltage-to-frequency converter 222 at line 224 is coupled via line 386 to selection circuitry at block 384. Similarly, the output of converter 242 at line 244 is coupled with the function of block 384 via a connection represented by line 388; the output of converter 170 at line 172 is similarly coupled as represented by line 390 and the converter output presented at line 188 is provided at line 392.

The utilization of microprocessor 362 in readout function 360 further contributes to the minimization of the amount of circuit and readout space required to achieve the multiple function capability of apparatus 10. Through the technique of sequential display of energy parameters, only a singular solid-state readout 72 is required. Exemplary of the rolling form of display, the sequentially rolling readouts may, for example, display watthours for an interval of about 10 seconds. The display then shows current watt demand, then peak watt demand, then cumulative watt demand and, finally, the time into the instant demand interval for the function being displayed. The data displayed for an 8-digit resister preferably are provided in the first six digits thereof, the remaining two digits displaying a function code, for example, looking to varhours, Qhours, watthours and the like. Preferably, an alphanumeric arrangement is utilized in these last two digit locations to indicate current demand, peak demand and cumulative demand. As noted above, with each of these 10 second interval displays, corresponding and identical data are available at the test jack positions 80 and 82 and the corresponding pulse rate is represented at the load rate indicator 78. Microprocessor 362 is programmed to establish time components which are utilized in the development of the roll-over readout procedure. In this regard, it may be noted that the pin 27 timer output of the device for the model noted is coupled, for example, by a line 394 to the P10 or "bit 0" input terminal. The signal thus applied at terminal P10, as represented in FIG. 6B, is a one second signal input derived from the internal timer of the device. Generally, in developing a principal time component, a coarse and fine adjustment procedure is utilized. Looking to the flow chart of FIG. 8A, the clock of the microprocessor is represented as generating a timer interrupt function represented at block 400. This interrupt frequency is dependent upon the internal clock frequency and is of relatively short interval, for example, on the order of about 50 ms. The "coarse" adjustment for the timing function is provided by the decrementing of an internal register R2 which is represented by the coarse adjustment block 402. The program then leads to a query position 404 wherein the status of register R2 is examined to determine whether it has reached a zero condition. In the event of an affirmative determination, then as represented at block 406, the program resets register R2 and complements a flag designated as flag 1 to provide an indication to the system software that one second has elapsed. Finally, the output of pin 27 is complemented. Accordingly, two indications that the output has changed are provided, one the signal change at output P27 and the complementing of flag 1.

The program then proceeds to reset the internal timing as represented at block 408. This resetting procedure forms a fine adjust arrangement. This same procedure is carried out in the event the query at block 404 is in the negative and register R2 has not reached a zero condition. The exit from the clock routine is represented at block 402.

Looking to FIG. 8B, the rolling display routine is revealed as utilized in conjunction with the basic one second timing function represented at flow chart 8A. Block 416 of the rolling display routine indicates that the inputs as described in conjunction with lines 372, 374, 376 and 378 are read and this reading occurs in similtaneous fashion. The function represented at block 416 also looks to the one second input signal at pin P10. The program then progresses to query block 418 wherein a determination is made as to whether any of the inputs represented at block 416 has changed. In the event of a negative answer, as represented at loop line 420, the program dwells until such time as an input change is revealed. In the event of an affirmative response to the query represented at block 418, then as represented at query block 424, a determination is made as to whether bit 0, i.e. input port P10 has changed. In the event of no change, as represented at loop line 422, the program carries out other processing functions, for example, storage of data in RAM 366 and the like.

Where the inquiry at block 424 indicates that bit 0 has changed, then as represented at block 426, the display timer is incremented in conjunction with a 10 second countdown. The program then progresses to the inquiry represented by block 428 at which position, a determination is made as to whether the timer has reached a 10 second level. In the event of an affirmative answer, then as represented at block 430, the system rolls to display the memory stored data of the next function. In the event of termination of a given sequence, then a restart at the initial one of the functions is carried out and, as represented at block 432, the display 72 is updated. In the event of a negative response to the inquiry at block 428, then as shown at loop line 434, the program is diverted to a display update function at block 432. Following the update of the display as represented at the latter block, as represented at loop line 436, the program returns to read all inputs as represented at block 416.

Returning to FIG. 2, it may be recalled that three push-button type switches are provided on the display panel 70 at 74-76 which are identified, respectively, as "hold", "set/reset" and "test/advance". These switches normally are retained behind window display cover 66. Where the operator wishes to carry out alterations or adjustments in the readout, the cover 66 is removed to gain access to switches 74-76. When hold buttom 74 is initially actuated, the display will return to the first function of the rolling sequence and remain at that readout. The load rate indicator 78 and the test jacks 80 and 82 will provide data corresponding with this first readout. For such an initial readout in a hold mode, by actuating set switch 75, the least significant figure of the digital readout will commence to flash. By pushing the advance function switch 76, the flashing readout will progress in value from 0 through 9. Once such digit is reading a desired value, the set switch 75 again is actuated and the next significant digit commences to flash for an alteration of the value thereof. By again actuating the hold switch 74, the display 72 advances to the next function and remains there. If such a next function represents a current demand, the actuation of any other button than the hold switch 74 will not be acknowledged. Where the "test" switch 76 is actuated in this mode, then all illuminating components will be illuminated to test their validity. By actuating the set/reset switch 75 in a hold mode when a peak demand is being displayed, the readout at 72 will assume a zero value. Once a peak demand is reset the set/reset button is ignored for 60 minutes to prevent accidental reset of the peak demand. Upon actuation of the hold switch 74 through an entire sequence, the return to the initial function readout causes the system to re-enter into a normally operational rolling mode.

Figure 9:
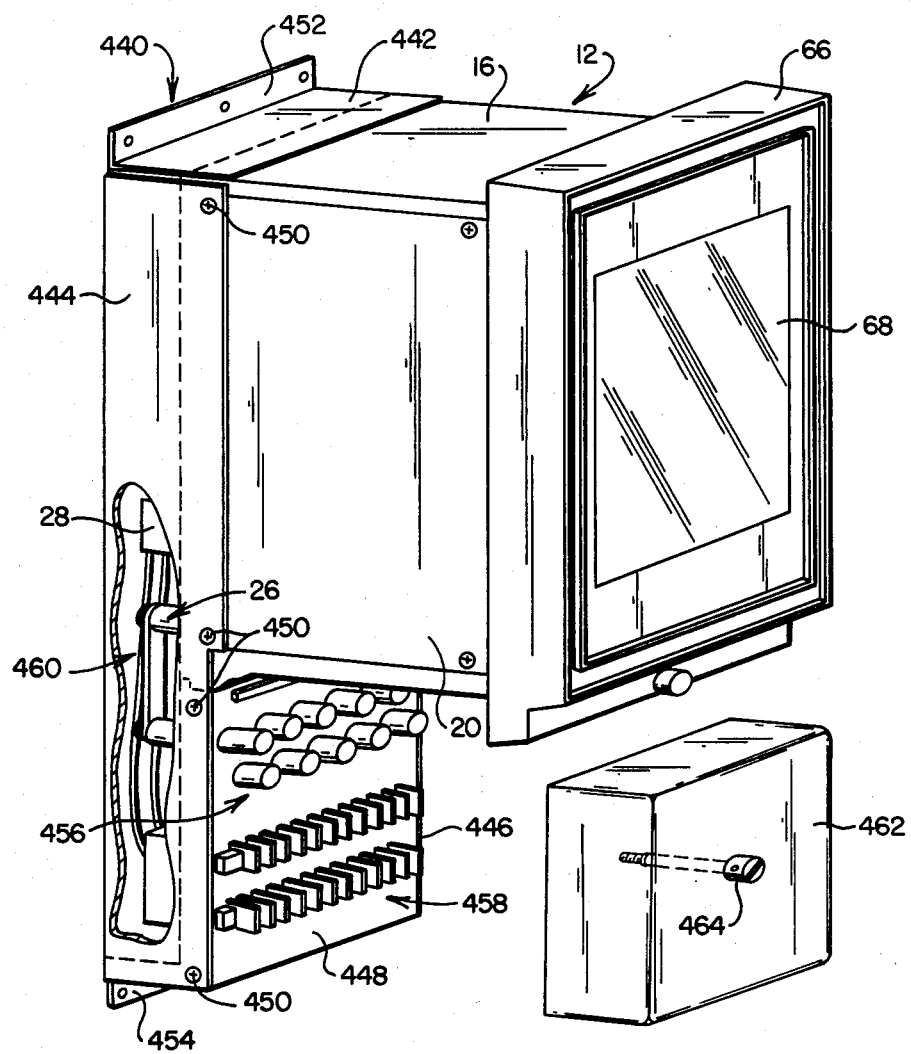
FIG. 9 is a perspective view of a surface mountable version of the apparatus shown in FIG. 1.

For many applications, the multi-function monitoring and metering apparatus as above disclosed will not be mounted within the wall of a panel display or the like but will be required to be mounted at a wall surface. Referring to FIG. 9, an adaptation of the apparatus 10 is shown in perspective detail arranged such that the output signal terminal assemblage 28 as well as the input terminal assemblage 26 are accessible from the front or display side of the apparatus. In the figure, the earlier-described housing structure 12 again is reproduced including all peripheral walls such as top wall 16 and sidewall 20 as shown. Additionally, the window assembly 66 with window 68 are revealed. As in the earlier embodiment, the assemblage of input terminals 26 are mounted on the rear wall of housing 12 as shown in the cutaway portion of the figure. Additionally, the assemblage of output signal terminals remain as shown in FIG. 1 as indicated in the instant drawing. However, the entire housing 12 is mounted by machine screws into a rectangular wall mounting component 440 having a back wall (not shown) from which are formed corresponding peripheral walls including a top wall 442, two side walls 444 and 446, a bottom wall (not shown) and a terminal access face 448. Housing 12 is nestably mounted within mounting component 440 and is retained in position by mounting screws as at 450. It may be observed that the rear wall 14 (not shown) of housing 12 forms a portion of the interior cavity defined by the remaining surfaces of component 440. Upwardly and downwardly disposed flanges shown, respectively, at 452 and 454 carry openings for receiving wall mounted screws or the like.

Terminal access face 448 supports an assemblage of input terminals 456 which are structured substantially identically to the array or assemblage of terminals 26 shown in FIG. 1. Similarly, the face 448 carries an assemblage of signal output terminals 458 which may be structured identically to the output terminals earlier described at 28 in FIG. 1.

Input terminals 456 are connected by hard wiring to their counterpart terminals at array 26 within the chamber defined by the interior of component 440. Similarly, the terminals of terminal ray 458 are coupled with corresponding terminals of the assemblage 28 and the hard wiring providing for such interconnection is represented generally at 460. Protection for the forwardly exposed terminal arrays 456 and 458 is provided by a cover 462 which is retained in place by a threaded connector 464 with a provision to secure the screw with a seal.

Since certain changes may be made in the above apparatus and assembly without departing from the scope of the invention herein involved, it is intended that all matter contained in the above description or shown in the accompanying drawings shall be interpreted as illustrative and not in a limiting sense.

We claim:

1. An assembly for monitoring an electrical power supply exhibiting given power and phase characteristics comprising:
   a housing having a rear wall and spaced apart peripheral walls defining an interior cavity extending inwardly from an opening;
   a plurality of discrete, spaced first conductors mounted upon a select said peripheral wall within said cavity;
   polyphase terminal means connected to an outwardly disposed surface of said housing, electrically communicating with said first conductors, for removable connection with a monitoring input from said power supply;
   a plurality of signal output terminals mounted upon and extending through and outwardly from a said wall and having a receptor portion within said cavity at a predetermined position;
   a drawout cradle, slidably nestable within said housing cavity having receiving means for supporting a plurality of electrical circuit components, a first portion thereof supporting a plurality of discrete second conductors spaced outwardly from said first conductors when said cradle is nestably positioned within said cavity and said cradle having a multi-conductor electrical connector located to be operationally engageable in multi-path electrically conducting relationship with said signal output terminals receptor portion when said cradle is nestably positioned within said cavity;
   connection plug means having a plurality of discrete spaced conductors selectively contactable with said first conductors and said second conductors when inserted within said housing cavity intermediate said select peripheral wall and said drawout cradle first portion for effecting the conduction of electricity from said first conductors to said second conductors;
   three monitoring function voltage transformers and three monitoring function current transformers mounted upon said drawout cradle, each electrically coupled with a predetermined said second conductor for being energized from said polyphase terminal means with respect to a select phase and having outputs corresponding therewith;
   readout means including a forward panel having a display providing visual digital data corresponding with electrical parameter signals and including processor means for selecting said electrical parameter signals for effecting said display provision of data, said readout means being mounted upon said drawout cradle, said panel being positioned at said housing opening when said cradle is nestably positioned with said cavity;
   multiplier circuit means mounted upon said drawout cradle, coupled to receive the outputs of said current and voltage transformers and coupled with said readout means and select conductors of said multi-conductor electrical connector for deriving said electrical parameter signals and for asserting said electrical parameter signals at said signal output terminals; and
   power supply means connectable with a source of power for effecting energization of said readout means and said multiplier circuit means.

2. The assembly of claim 1 in which said multiplier circuit means includes:
   reference supply means coupled with said power supply means for deriving a reference voltage signal;
   first multiplier network means responsive to said monitoring function transformer voltage and current outputs and said reference voltage signal for providing a Q value signal;
   second multiplier network means responsive to said reference voltage signal, said monitoring function transformer voltage and current outputs for providing a watt value signal; and
   var deriving network means responsive to said Q value signal and said watt value signal for deriving a var value signal.

3. The assembly of claim 2 in which said multiplier circuit means further comprises third multiplier network means responsive to said reference voltage signal and a said monitoring function transformer voltage output for providing a volts squared value signal.

4. The assembly of claim 2 in which:
   said multiplier circuit means includes:
   first solid state voltage to frequency converter means responsive to said watt value signal for generating said electrical parameter signals in pulsed form having watt-hour values;
   second solid state voltage to frequency converter means responsive to said Q value signal for generating said electrical parameter signals in pulsed form having Q-hour values; and
   said readout means includes test jack means at said forward panel for carrying output signals corresponding with said electrical parameter signals having said watthour values and Qhour values.

5. The assembly of claim 1 including:
   first rectifier means mounted within said drawout cradle coupled with said monitoring function voltage transformer outputs and with select electrical paths of said multi-conductor electrical connector for providing three discrete phase related voltage analog outputs at select said signal output terminals; and second rectifier means mounted within said drawout cradle, coupled with said monitoring function current transformer outputs and with select electrical paths of said multi-conductor electrical connector for providing three discrete phase related current analog outputs at select said signal output terminals.

6. The assembly of claim 5 including means defining three discrete voltage analog test outputs mounted upon said drawout cradle adjacent said forward panel readout means, each said test output being coupled with a select said first rectifier means output for providing test locations thereof.

7. The assembly of claim 5 including means defining three discrete current analog test outputs mounted upon said drawout cradle adjacent said forward panel readout means, each said test output being coupled with a select said second rectifier means output for providing test locations thereof.

8. The assembly of claim 1 in which
said multiplier circuit means includes:
reference supply means coupled with said power supply means for deriving a reference voltage signal;
first multiplier network means responsive to said monitoring function transformer voltage and current outputs and said reference voltage signal for providing a first phase defined parameter signal;
first solid state voltage-to-frequency converter means responsive to said first phase defined parameter signal for generating a first energy parameter signal;
second multiplier network means responsive to said monitoring function transformer voltage and current outputs and said reference voltage signal for providing a second phase defined parameter signal;
second solid state foltage to frequency converter means responsive to said second phase defined parameter signal for generating a secod energy parameter signal;
said readout means includes:
test position means in the vicinity of said forward panel;
driver means responsive to an input command signal to drive said display;
test point selector means actuable to selectively couple said test position means with a select one of said first and second energy parameter signals;
said processor means, includes memory means, responsive to said first and second energy parameter signals for deriving said input command signals to effect generation of said visual digital data corresponding with said first and second pulse categorized energy parameter signals for predetermined intervals in a progressing sequence while simultaneously effecting a corresponding actuation of said test point selector means.

9. The assembly of claim 1 in which:
said polyphase terminal means and said signal output terminals are mounted upon said housing rear wall;
said housing includes a wall mounting component coupled therewith and forming a chamber with said rear wall, said wall mounting component being configured to provide a terminal access face adjacent said front panel;

second polyphase terminal means electrically connected in comon with said polyphase terminal means and mounted upon said terminal access face; and a second plurality of signal output terminals electrically connected in common with said plurality of signal output terminals and mounted upon said terminal access face.

10. Apparatus for monitoring an electrical power supply comprising:
a housing having rear, side top and bottom walls defining an interior chamber extending inwardly from a front access opening;
a plurality of discrete, spaced apart first conductors mounted upon said bottom wall within said chamber;
a plurality of polyphase terminals connected to the outwardly disposed surface of said rear wall, each electrically coupled with a predetermined one of said first conductors and removably connectable with a monitoring input from said power supply;
a plurality of signal output terminals mounted upon said rear wall and extending to a receptor portion within said chamber at a predetermined location upon said rear wall;
a drawout cradle, slideably insertable through said access opening and nestable within said housing chamber, having receiving means for supporting a plurality of circuit boards in substantially parallel adjaency, a plurality of discrete, second conductors positioned upon said cradle and spaced above said first conductors when said cradle is nestably positioned within said chamber, means defining a multiconductor card connector extending rearwardly from said cradle and insertable within said signal output terminals receptor portion to establish a circuit completing relationship with said terminals;
connection plug means having a plurality of discrete spaced conductors selectively contactable with said first conductors and said second conductors when inserted within said housing chamber intermediate said first and second conductors, for effecting the conduction of electricity from said first conductors to said second conductors;
three, voltage monitoring transformers and three, current monitoring transformers mounted upon said drawout cradle, each electrically coupled with a predetermined said second conductor for being energized from said polyphase terminal means with respect to a select phase and having stepped down outputs corresponding therewith;
readout means including a panel having a deisplay providing visual digital data corresponding with power parameter signals and including processor means for selecting said power parameter signals for effecting said display provision of data, said readout means being mounted upon said cradle, said panel being positioned at said housing opening when said cradle is nestably positioned within said chamber;
multiplier circuit means mounted upon said drawout cradle, coupled to receive said outputs of said current and voltage transformers and coupled with said readout means and conductors of said means defining a card connector for deriving power parameter signals for selection by said processor means and for assertion at said signal output terminals; and power supply means connectable with a source of power for effecting energization of said readout means and said multiplier circuit means.

11. The apparatus of claim 10 in which said multiplier circuit means includes:
reference supply means for deriving a reference voltage signal;
three multiplier networks responsive to the said stepped down outputs of said three voltage monitoring transformers, said three current monitoring transformer stepped down outputs and said reference voltage signal for providing a Q value signal;
three multiplier networks responsive to said three voltage monitoring transformer stepped down outputs, said three current monitoring transformer stepped down outputs and said voltage reference signal for providing a watt value signal; and
var derivation network means responsive to said Q value signal and said watt value for deriving a var value signal.

12. The apparatus of claim 11 in which said multiplier circuit further comprises multiplier network means responsive to said reference voltage signal and a said voltage monitoring transformer stepped down output for providing a volts$^2$ value signal.

13. The apparatus of claim 10 including:
three rectifier network means mounted within said drawout cradle, coupled with respective said three voltage monitoring transformers and with select electrical paths of said means defining a multi-conductor card connector for providing three discrete phase related voltage analog outputs at select said signal output terminals; and
a second three rectifier network means mounted within said drawout cradle, coupled with said stepped down outputs of said three respective three current monitoring transformers and with select electrical paths of said multiconductor card connector for providing three discrete phase related current analog outputs at select said signal output terminals.

14. The apparatus of claim 10 in which:
said multiplier circuit means includes:
reference supply means for deriving a reference voltage;
first multiplier network means, respponsive to said reference voltage and to said stepped down outputs of said three voltage monitoring transformers and said three current monitoring transformers for providing a first monitoring signal;
first voltage to frequency converter means responsive to said first monitoring signal for deriving a first said power parameter signal;
second multiplier network means, responsive to said reference voltage and to said stepped down outputs of said three current monitoring transformers and said three voltage monitoring transformers for providing a second monitoring signal phase displaced form said first monitoring signal;
second voltage-to-frequency converter means responsive to said second monitoring signal for deriving a second phase power parameter signal;
said readout means includes:
test position means in the vicinity of said panel;
readout means drivable to provide said select visual electrical metering digital readouts;
driver means responsive to an input command signal to selectively drive said readout means;
test point selector means actuable to selectively couple said test position means with a select one of said first and second pulse categorized energy parameter signals;
microporcessor means, including memory means, responsive to said first and second pulse categorized power parameter signals for deriving said input command signals to effect a said visual digital readout corresponding with said first and second pulse categorized power parameter signals for predetermined intervals a predetermined sequence while simultaneously effecting a corresponding actuation of said test point selector means.

15. Apparatus for monitoring an electrical power supply, comprising:
a housing having a rear wall and spaced apart peripheral walls defining an interior chamber;
first terminal means supported by said housing and connectable with a monitoring input from said power supply;
second terminal means supported by said housing for providing signal outputs;
voltage transformer means supported by said housing, and energizable from said first terminal means for providing voltage monitoring function signals;
current transformer means supported by said housing and energizable from said first terminal means for providing current monitoring function signals;
readout means having a display providing digital data corresponding with power parameter signls asserted thereto;
first multiplier network means responsive to said voltage and current monitoring function signals for providing analog watt signals;
second multiplier network means responsive to said voltage and current monitoring function signals for providing analog Q signals;
var deriving network means responsive to said analog watt and Q signals to derive analog var signals corresponding therewith;
voltage-to-frequency converter means responsive to said analog watt and Q signals for deriving said power parameter signals and asserting said power parameter signls at said readout means; and
circuit means for providing said analog var signls as signal outputs of said second terminal means.

16. The apparatus of claim 15 in which said var deriving network means is configured to effect the subtraction of a diminished value of said analog watt signals from said analog Q signals to derive said analog var signals.

17. The apparatus of claim 15 in which:
said voltage transformer means comprises three transformers each associated with a predetermined phase of said power supply;
said current transformer means comprises three transformers each associated with a predetermined phase of said power supply;
said first multiplier network means comprises a first group of three discrete time division multiplier networks, each responsive to the output of a select one of said three voltage transformers and the corresponding phase defined output of a select one of said three current transformers, and first summing network means for combining the outputs of said three discrete time division multiplier networks to derive said analog watt signals.

18. The apparatus of claim 17 in which said second multiplier network means comprises a second group of three discrete time division multiplier networks, each responsive to the output of a select one of said three voltage transformers and the corresponding phase defined output of a select one of said three current transformers, and second summing network means for combining the outputs of said second group of three discrete time division multiplier networks to derive said analog Q signals.

19. The apparatus of claim 15 further comprising:

first rectifier means supported by said housing, coupled intermediate said voltage transformer means and said second terminal means for providing phase related current analog outputs at said terminal means.

20. The apparatus of claim 19 further comprising second rectifier means supported by said housing, coupled intermediate said current transformer means and second terminal means for providing phase related current analog outputs at said second terminal means.

* * * * *